United States Patent
Yamazaki et al.

(10) Patent No.: US 8,456,084 B2
(45) Date of Patent: Jun. 4, 2013

(54) ORGANIC LIGHT-EMITTING DEVICE

(75) Inventors: Takuro Yamazaki, Kawasaki (JP); Kohei Nagayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 882 days.

(21) Appl. No.: 11/680,514

(22) Filed: Feb. 28, 2007

(65) Prior Publication Data

US 2007/0222382 A1 Sep. 27, 2007

(30) Foreign Application Priority Data

Mar. 22, 2006 (JP) .................................. 2006-079058
Jan. 30, 2007 (JP) .................................. 2007-019470

(51) Int. Cl.
*H01L 51/52* (2006.01)

(52) U.S. Cl.
USPC .......................................... 313/512; 313/504

(58) Field of Classification Search
USPC ..................... 313/512, 503, 506, 504; 257/72, 257/100
See application file for complete search history.

(56) References Cited

U.S. PATENT DOCUMENTS

| | | | |
|---|---|---|---|
| 6,300,224 B1 * | 10/2001 | Arima et al. ................... | 438/462 |
| 6,864,629 B2 | 3/2005 | Miyaguchi et al. ........... | 313/512 |
| 7,109,649 B2 | 9/2006 | Kato et al. ..................... | 313/504 |
| 2002/0180371 A1 * | 12/2002 | Yamazaki et al. ......... | 315/169.3 |
| 2003/0168966 A1 * | 9/2003 | Kobayashi et al. ........... | 313/495 |
| 2005/0180721 A1 * | 8/2005 | Hayashi et al. ............... | 385/147 |
| 2005/0285522 A1 * | 12/2005 | Han et al. ....................... | 313/512 |
| 2006/0113617 A1 | 6/2006 | Kawamura et al. ........... | 257/414 |
| 2007/0182322 A1 | 8/2007 | Nagayama ..................... | 313/509 |
| 2007/0273271 A1 | 11/2007 | Yamazaki et al. ............ | 313/504 |
| 2008/0018229 A1 * | 1/2008 | Yamazaki ..................... | 313/498 |
| 2008/0018230 A1 | 1/2008 | Yamada et al. ............... | 313/498 |

FOREIGN PATENT DOCUMENTS

| | | | |
|---|---|---|---|
| CN | 1612650 | | 5/2005 |
| CN | 1612650 A | * | 5/2005 |
| JP | 2000-223264 | | 8/2000 |
| JP | 2003-223992 | | 8/2003 |
| JP | 2005-319678 | | 11/2005 |
| JP | 2005-335067 | | 12/2005 |

OTHER PUBLICATIONS

Japanese Office Action issued in counterpart application No. 2007-019470 dated Apr. 13, 2010—2 pages.

* cited by examiner

*Primary Examiner* — Nimeshkumar Patel
*Assistant Examiner* — Steven Horikoshi
(74) *Attorney, Agent, or Firm* — Fitzpatrick, Cella, Harper & Scinto

(57) ABSTRACT

A organic light-emitting device includes a substrate including at least a base material, at least one organic light-emitting element which includes (a) a pair of electrodes provided on the substrate and an organic compound layer disposed between the pair of electrodes, and (b) provides a light-emitting area, an inorganic sealing layer provided on the organic light-emitting element and the surface of the substrate, and an adhesion layer which is provided between the substrate and the inorganic sealing layer and only on the periphery of the light-emitting area for closely contacting the surface of the substrate and the inorganic sealing layer, and inhibits moisture from intruding at an edge of the inorganic sealing layer.

5 Claims, 7 Drawing Sheets

ORGANIC LIGHT-EMITTING DEVICE

BACKGROUND OF THE INVENTION

1. Field of the Invention

The present invention relates to an organic light-emitting device.

2. Description of the Related Art

Recently, organic light-emitting devices, which are self-light-emitting devices, have attracted attention as a flat panel display. In organic light-emitting devices, the presence of moisture or oxygen readily causes degradation of characteristics thereof. Even a trace amount of moisture causes, for example, a separation of an organic compound layer from an electrode layer, resulting in generation of dark spots. Therefore, an organic light-emitting portion is typically covered with an etching glass cover, a sealing agent is applied on the periphery of the organic light-emitting portion, and a moisture absorbent is placed inside thereof so that moisture intruding from the sealing surface is absorbed by the moisture absorbent, thereby ensuring the lifetime of an organic light-emitting device. However, in order to realize a space-saving flat panel display including a thin organic light-emitting device, it is necessary to eliminate the space taken up by the moisture absorbent and to provide a thinner organic light-emitting device. Consequently, a method of sealing an organic light-emitting device that does not require a large amount of moisture absorbent has been desired. Therefore, a highly functional sealing layer for preventing moisture and oxygen from intruding into the organic compound layer has been desired.

To solve these problems, recently, a sealing layer composed of a silicon oxynitride film formed by chemical vapor deposition (CVD) or sputtering, and a sealing layer prepared by stacking a ceramic film and an organic film have been proposed as sealing layers of organic light-emitting devices.

Japanese Patent Laid-Open No. 2000-223264 proposes a structure in which a first inorganic sealing layer, a resin sealing layer, and a second inorganic sealing layer are stacked in that order. This patent document describes that an organic electroluminescent (EL) element which has low residual stress and in which moisture can be satisfactorily blocked can be provided.

Japanese Patent Laid-Open No. 2003-223992 proposes a structure in which an organic light-emitting layer is covered with an inorganic film, and a color filter formed on a cover plate is disposed at a position distant from an organic EL element. This patent document describes that degradation of an organic EL layer caused by moisture or a gas component generated from the color filter can be suppressed.

As described in these patent documents, when a sealing layer for preventing the intrusion of moisture and a gas component is formed of an inorganic film or stacked layers including an inorganic film, moisture and the gas component can be prevented from intruding into an organic light-emitting layer via the sealing layer.

However, in the patent documents cited above, moisture and a gas component that intrude from the edge of the organic light-emitting device to the organic light-emitting layer are not considered. The present inventors have found that even when a sealing layer having excellent moisture-proof property is disposed on a light-emitting portion as a component for preventing moisture intrusion or the like, which causes degradation of the organic light-emitting device, moisture can intrude from the interface between the sealing layer and a layer adjacent to the sealing layer, thereby significantly affecting the light-emitting area.

Furthermore, in a method of producing an organic light-emitting device, electrodes and an organic layer are formed on a single substrate, a sealing layer is formed, and the substrate is then cut. Thus, a plurality of organic light-emitting devices are produced from a single substrate. The present inventors have also found that when organic light-emitting devices are produced by such a method, the sealing layer is exposed on the cut surface, and furthermore, a portion of the sealing layer is separated by the cut or cracks are formed in the sealing layer.

As described above, when the sealing layer is exposed and separation of a portion of the sealing layer or formation of cracks occurs, moisture or the like intrudes from the interface of the sealing layer or the portion where the sealing layer has been separated, thereby hindering light emission.

SUMMARY OF THE INVENTION

The present invention provides an organic light-emitting device in which intrusion of moisture or the like from the edge of a sealing layer in the organic light-emitting device is prevented and which can maintain high-quality light emission for a long period of time.

The present invention provides an organic light-emitting device including a substrate including at least a base material, at least one organic light-emitting element disposed on the substrate, and an inorganic sealing layer provided on the organic light-emitting element and the surface of the substrate, wherein the organic light-emitting element includes (a) a pair of electrodes provided on the substrate and an organic compound layer disposed between the pair of electrodes, and (b) provides a light-emitting area. In the organic light-emitting device, an adhesion layer that provides a close contact between the surface of the substrate and the inorganic sealing layer is provided between the substrate and the inorganic sealing layer and only on the periphery of the light-emitting area.

According to the present invention, intrusion of moisture or the like from the edge of the sealing layer in the organic light-emitting device can be prevented, and high-quality light emission can be maintained for a long period of time.

Further features of the present invention will become apparent from the following description of exemplary embodiments with reference to the attached drawings.

DESCRIPTION OF THE PREFERRED EMBODIMENTS

Figure 1:
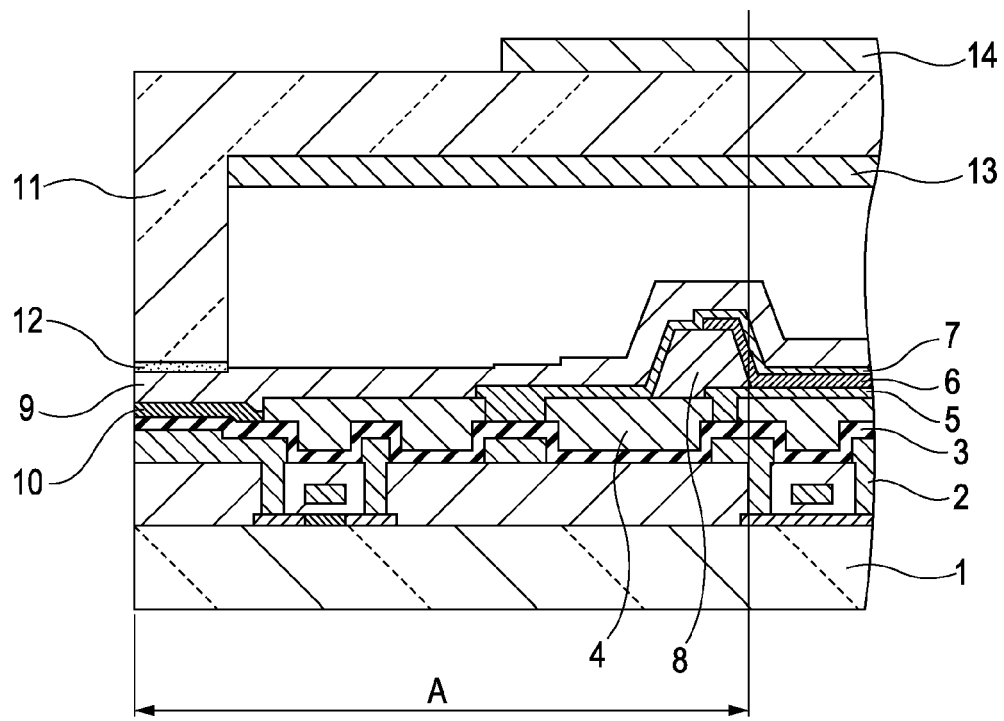
FIG. 1 is a schematic cross-sectional view showing an organic light-emitting device according to an embodiment of the present invention.

An organic light-emitting device of the present invention includes a substrate including at least a base material, at least one organic light-emitting element disposed on the substrate, and an inorganic sealing layer provided on the organic light-emitting element and the surface of the substrate, wherein the organic light-emitting element includes (a) a pair of electrodes provided on the substrate and an organic compound layer disposed between the pair of electrodes, and (b) provides a light-emitting area. In the organic light-emitting device, an adhesion layer brings the surface of the substrate into close contact with the inorganic sealing layer and is provided between the substrate and the inorganic sealing layer and only on the periphery of the light-emitting area.

Since the layer (adhesion layer) that brings the sealing layer into close contact with the surface of the substrate is disposed on the periphery of the light-emitting area, a structure in which moisture or the like does not easily intrude into the organic light-emitting element can be provided. In the present invention, the adhesion layer is provided between the substrate and the inorganic sealing layer and only on the periphery of the light-emitting area. That is, the adhesion layer is not disposed on the light-emitting area. Accordingly, the distance between the organic light-emitting element and the inorganic sealing layer can be decreased, thus preventing the intrusion of moisture or the like more reliably. Furthermore, when light emitted from the organic compound layer is extracted to the exterior of the light-emitting device through the inorganic sealing layer, total light absorption can be reduced in order to increase the light extraction efficiency.

The sealing layer, which is provided in order to prevent intrusion of moisture or the like, has a high shielding performance where moisture or the like impinges on the layer surface. However, the sealing layer does not necessarily have satisfactory shielding performance when moisture or the like seeks to penetrate the edge interface between the sealing layer and a layer adjacent to the sealing layer or moisture or the like intrudes from a defect portion formed in the sealing layer. Therefore, it is desired that not only moisture passing through the layer, but also moisture intruding from an interface or a defect portion or the like, be shielded.

The shielding performance for moisture intruding from an interface or the like depends on the chemical affinity between the sealing layer and the adjacent layer and surface irregularities of the adjacent layer. More specifically, as the chemical or physical affinity increases, the adhesivity between the sealing layer and the adjacent layer increases to increase the shielding performance.

Consequently, in the present invention, intrusion of moisture or the like from the interface of the sealing layer is prevented by disposing an adhesion layer having high adhesivity to the sealing layer.

The organic light-emitting device of the present invention is also advantageous in that intrusion of moisture or the like can be prevented when a substrate having a sealing layer thereon is cut in the production process.

In a method of producing an organic light-emitting device, electrodes and an organic layer are formed on a single substrate, a sealing layer is formed, and the substrate is then cut. Thus, a plurality of organic light-emitting devices are produced from a single substrate. The sealing layer has a dense structure so that moisture does not pass through the thickness direction of the sealing layer. On the other hand, since the sealing layer is a hard layer, cracks are formed in the sealing layer or a portion of the sealing layer is separated during cutting.

In the organic light-emitting device of the present invention, an adhesion layer is disposed on the periphery of the light-emitting area so as to be adjacent to a sealing layer. Accordingly, formation of cracks in the sealing layer can be prevented, and separation of a portion of the sealing layer can be prevented. Even if cracks are formed, propagation of the cracks to the light-emitting area can be prevented.

Accordingly, since the organic light-emitting device of the present invention is highly effective in preventing intrusion of moisture or the like, the light-emitting portion of the organic EL element is not easily degraded and high-quality light emission can be maintained for a longer period of time.

The organic light-emitting device according to the present invention can be suitably used as a planar light-emitting member for a backlight of liquid crystal display apparatuses. When a plurality of organic compound layers corresponding to light-emitting portions of a plurality of colors such as red (R), green (G), and blue (B) are disposed, the device of the present invention can be suitably used as an organic light-emitting device.

The organic light-emitting device according to the present invention can be suitably used in a display of a television system, a monitor of personal computers, a mobile phone, or the like. In particular, the organic light-emitting device according to the present invention can be suitably used in a display of mobile devices the use of which in wide ranges of temperature and humidity is assumed and which require high environmental resistance. A display apparatus including the organic light-emitting device of the present invention in the display thereof can realize a high-quality display for a longer period of time.

The organic light-emitting device according to the present invention can also be suitably used for an image pickup apparatus such as a digital camera. An image pickup apparatus including the organic light-emitting device of the present invention in the display thereof can realize a high-quality display for a longer period of time.

Figure 2:
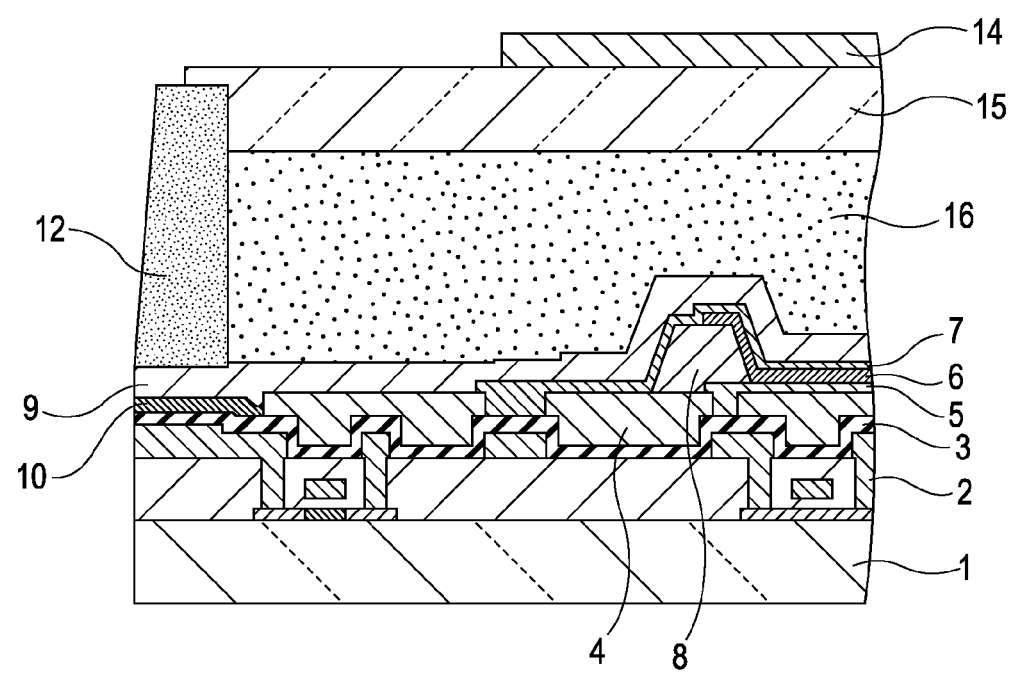
FIG. 2 is a schematic cross-sectional view showing an organic light-emitting device according to another embodiment of the present invention.
Figure 3:
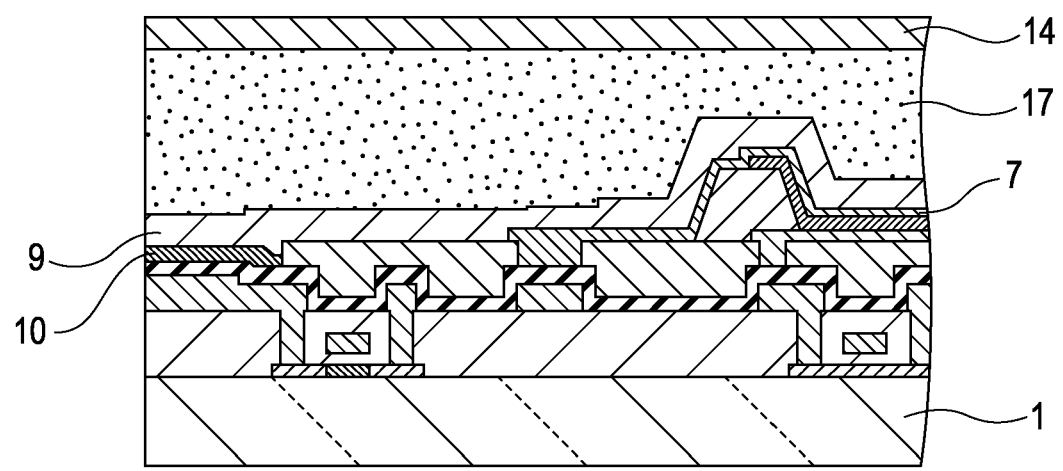
FIG. 3 is a schematic cross-sectional view showing an organic light-emitting device according to another embodiment of the present invention.

Embodiments of the present invention will now be described with reference to FIGS. 1 to 3. FIG. 1 is a schematic cross-sectional view showing a part of an organic light-emitting device according to an embodiment of the present invention. Each of FIGS. 2 and 3 is a schematic cross-sectional view showing a part of an organic light-emitting device according to another embodiment of the present invention. In the figures, reference numeral 1 indicates a glass substrate (base material), reference numeral 2 indicates a TFT (switching element), reference numeral 3 indicates an insulating layer, reference numeral 4 indicates a planarizing layer, reference numeral 5 indicates a first electrode, reference numeral 6 indicates an organic compound layer (organic EL layer), reference numeral 7 indicates a second electrode, reference numeral 8 indicates an element isolation film, reference numeral 9 indicates a sealing layer, reference numeral 10 indicates an adhesion layer, reference numeral 11 indicates etching glass, reference numeral 12 indicates an adhesive, reference numeral 13 indicates a moisture-absorbing layer, and reference numeral 14 indicates a circular polarizer. Reference numeral 15 indicates cover glass, reference numeral 16 indicates a filling material, and reference numeral 17 indicates a pressure-sensitive adhesive.

In the organic light-emitting device shown in FIG. 1, a TFT 2, an insulating layer 3, and an organic planarizing layer 4 are stacked on a glass substrate 1 in that order. In the present invention, this stacked layered product including these members is referred to as "substrate". A first electrode 5 constituting a pixel unit is provided thereon, and the periphery of each pixel is covered with an element isolation film 8 composed of a polyimide resin. An organic compound layer 6 in which a hole-transporting layer, a luminescent layer, an electron-transporting layer, an electron injection layer, and the like are sequentially stacked is provided thereon. A second electrode 7 is provided thereon. The organic compound layer 6 does not necessarily include all these layers, and it is sufficient that the organic compound layer 6 includes at least the luminescent layer. When an electric current is supplied between the first electrode 5 and the second electrode 7, the luminescent layer disposed therebetween emits light. The portion at which light is emitted forms an organic EL light-emitting portion. Furthermore, a sealing layer 9 composed of an inorganic film is provided so as to cover the second electrode 7, the organic compound layer 6, the element isolation film 8, and the planarizing layer 4 except for an extraction electrode (not shown). An adhesion layer 10 is disposed between the glass substrate 1 and the sealing layer 9, more specifically, between the insulating layer 3 and the sealing layer 9. The upper part of the stacked layers including the sealing layer 9 is covered with etching glass 11 having a structure in which a recess is provided at the pixel portion. The periphery of the etching glass 11 is sealed with an adhesive 12. A moisture-absorbing layer 13 is provided on the inner surface of the etching glass 11 facing the organic compound layer 6. Furthermore, a circular polarizer 14 is provided on the etching glass 11.

In the organic light-emitting device according to this embodiment, the adhesion layer 10 is disposed between the insulating layer 3 and the sealing layer 9 on the periphery of a light-emitting area. The term "periphery of a light-emitting area" does not represent areas between pixels in the case where the organic light-emitting device includes a plurality of pixels but includes an area that is adjacent to the light-emitting area and that is close to the edge of the panel. The periphery of a light-emitting area is also referred to as a "frame area". In FIG. 1, the periphery of the light-emitting area represents the area A. The presence of adhesion layer 10 effectively prevents intrusion of moisture or the like from the edge of the panel which is otherwise bounded by the interface between sealing layer 9 and insulating layer 3.

In the organic light-emitting device shown in FIG. 2, a stacked structure including from the glass substrate 1 to the sealing layer 9 is provided as in the organic light-emitting device shown in FIG. 1. The upper part of the stacked layers including the sealing layer 9 is covered with cover glass 15. A filling material 16 is disposed between the cover glass 15 and the sealing layer 9. The periphery of the cover glass 15 is sealed with an adhesive 12. Furthermore, a circular polarizer 14 is provided on the cover glass 15.

In the organic light-emitting device shown in FIG. 3, a stacked structure including from the glass substrate 1 to the sealing layer 9 is provided as in the organic light-emitting device shown in FIG. 1. A circular polarizer 14 is directly bonded on the upper part of the stacked layers including the sealing layer 9 with a pressure-sensitive adhesive 17.

In the present invention, members disposed on the sealing layer 9 can have any one of the structures shown in FIGS. 1 to 3 but may have another structure.

The material of the first electrode 5 of the organic light-emitting device of the present invention is not particularly limited as long as the material is a highly conductive electrode material. Examples thereof include highly reflective materials such as Cr, Al, and Ag. Transparent electrodes such as indium tin oxide (ITO) and indium zinc oxide (IZO) may be stacked and used as the first electrode 5.

The material of the second electrode 7 is not particularly limited as long as the material is a highly conductive electrode material. For example, the second electrode 7 is composed of a highly transparent or semitransparent material. An oxide film containing indium (In) such as ITO or IZO, a Ag film, or the like can be used as the second electrode 7.

In the present invention, the organic light-emitting device may have a structure in which light is extracted from the first electrode 5 or a structure in which light is extracted from the second electrode 7. That is, the organic light-emitting device of the present invention may be a top-emission-type light-emitting device or a bottom-emission-type light-emitting device.

The material of the sealing layer 9 is not particularly limited as long as the material has a high shielding ability against moisture or a gas component. However, an inorganic film, which is known as a film having a superior moisture and gas barrier property, can be used. Specific examples thereof include a SiN film and a SiON film. The sealing layer 9 may be composed of stacked layers including two or more films having different compositions. The sealing layer 9 may have a stacked structure including an inorganic film and an organic film in accordance with characteristics required for the sealing layer 9. However, an organic film that relatively easily transmits moisture is not exposed at an edge, but is covered on an edge of the organic light-emitting device because the exposed organic film becomes a propagation path for moisture or a gas component.

The inorganic film used for the sealing layer 9 of the present invention can be formed by, for example, plasma CVD. When the excitation frequency of the plasma CVD is the VHF band ranging from 30 to 100 MHz, the ion bombardment of the plasma can be weakened, thereby suppressing thermal damage to the element. Furthermore, such a process can provide a satisfactory inorganic sealing layer which is dense and has no defects, whose coverage property of inclined planes and irregularities is satisfactory, and which has an excellent moisture-proof property and exhibits low stress.

In the inorganic sealing layer, the hydrogen concentration, i.e., the ratio of the number of hydrogen atoms to the total number of silicon, nitrogen, hydrogen, and oxygen atoms can be in the range of 12 to 32 atomic percent. In this case, its adhesivity to an organic sealing layer, which is an underlayer, and the coverage property of irregularities are satisfactory. Furthermore, thermal stress can be effectively relieved, and a significant effect of suppressing temperature rise due to light emission of the organic light-emitting device, can be achieved. When the hydrogen concentration is in the range of 17 to 28 atomic percent, a more significant effect can be achieved.

The sealing layer used in the present invention may be composed of stacked layers including two or more films having different compositions.

For example, when the hydrogen concentration in the inorganic sealing layer has a gradient in the range of 12 to 32 atomic percent, thermal stress in the inorganic sealing layer can be effectively relieved and the light extraction efficiency can be increased. Furthermore, in order to increase the light extraction efficiency, the hydrogen concentration can be increased to 32 atomic percent or higher in the thickness direction of the film.

Including in the organic light-emitting device an inorganic sealing layer in which the hydrogen concentration has a gradient, achieves an excellent moisture-proof property, and, in addition, light reflection caused by stacking films having different refractive indices can be suppressed to improve the light transmittance.

The adhesion layer 10 of the present invention will now be described.

The adhesion layer 10 of the present invention is an interlayer for improving the adhesivity of the sealing layer 9 to either the insulating layer 3 or the planarizing layer 4 provided on the glass substrate 1. The adhesion layer 10 can provide prevent moisture or a gas component from intruding at the edge of the organic light-emitting device. In the structure that does not include the adhesion layer 10 of the present invention, satisfactory adhesivity between the sealing layer 9 and the insulating layer 3 or between the sealing layer 9 and the planarizing layer 4 is not obtained. Accordingly, moisture or the like can intrude from the interface edge between the sealing layer 9 and the layer adjacent to the sealing layer 9. Furthermore, formation of cracks in the sealing layer 9 or separation of a portion of the sealing layer 9 is inevitable at cutting positions in the periphery of the light-emitting area of the organic light-emitting device. Such cracks and separation of a portion of the sealing layer 9 at the cutting positions of the organic light-emitting device become a propagation path for moisture or a gas component, resulting in the degradation of light emission in the organic compound layer. To reduce propagation in an area where cracks are formed in the sealing layer 9 or where a portion of the sealing layer 9 is separated, the cutting positions can be changed so as to form a larger peripheral area. However, in such an instance, the area of the periphery of the light-emitting area is increased, and this is contrary to the desire to decrease the width of the frame of the organic light-emitting device.

Figure 4:
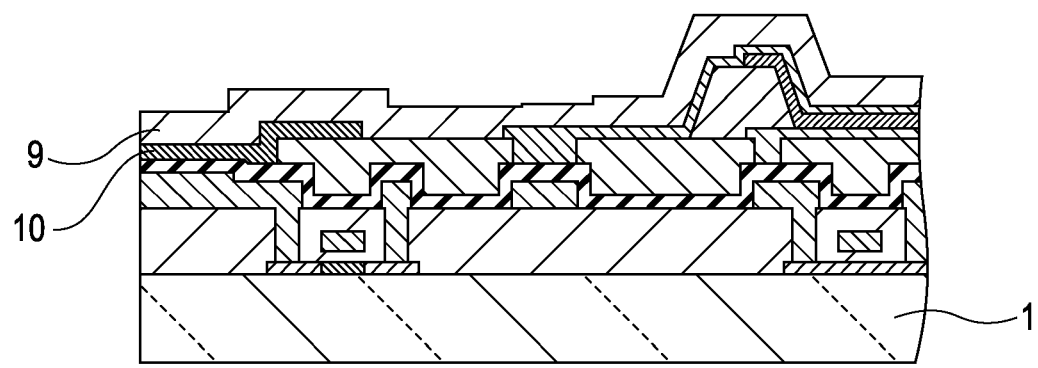
FIG. 4 is a schematic cross-sectional view showing an example of a position where an adhesion layer of the present invention is formed.
Figure 5:
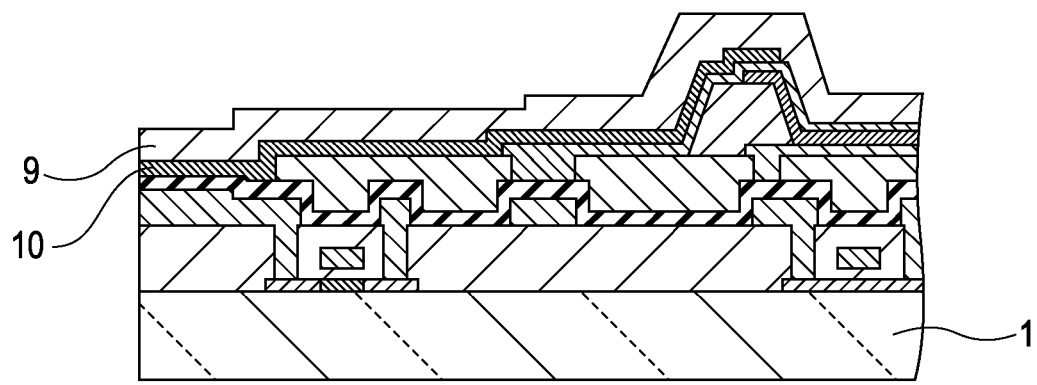
FIG. 5 is a schematic cross-sectional view showing another example of a position where the adhesion layer of the present invention is formed.
Figure 6:
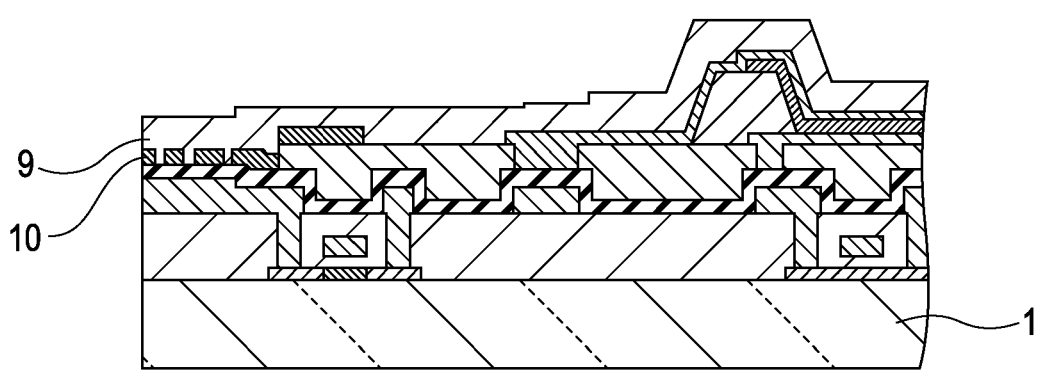
FIG. 6 is a schematic cross-sectional view showing another example of a position where the adhesion layer of the present invention is formed.

As shown in FIGS. 1 to 3, the adhesion layer 10 of the present invention can be provided on the frame area disposed outside the light-emitting area where the organic compound layer 6 is provided, and provided outside the area where the planarizing layer 4 is provided. In addition, as shown in FIG. 4, the adhesion layer 10 may be provided on the planarizing layer 4. Alternatively, as shown in FIG. 5, the adhesion layer 10 may be provided on the second electrode 7. The adhesion layer 10 may be continuously formed in the direction of the light-emitting area, as shown in FIGS. 1 to 5. Alternatively, the adhesion layer 10 may be discontinuously formed, as shown in FIG. 6.

Figure 7:
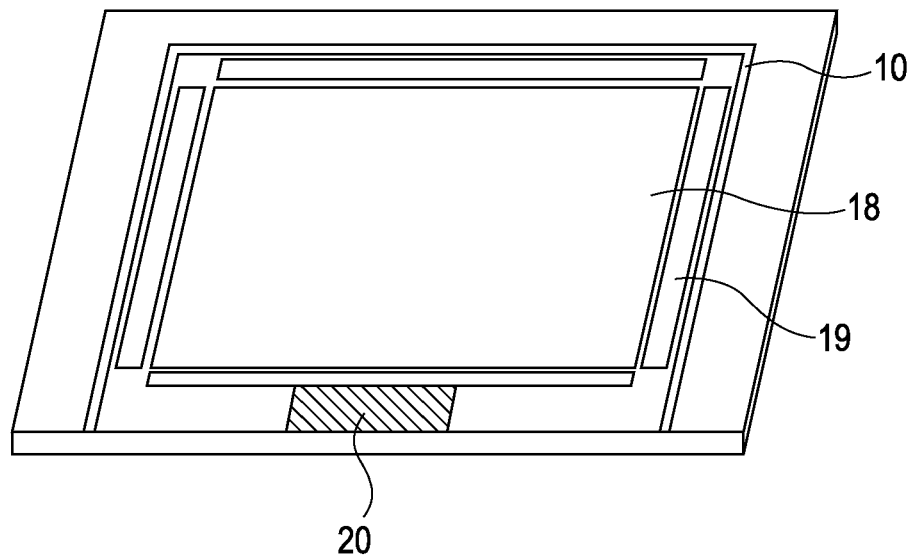
FIG. 7 is a schematic top view showing an example of a position where the adhesion layer of the present invention is formed.

Furthermore, the adhesion layer 10 of the present invention may be disposed on the entire periphery of the light-emitting area. Alternatively, the adhesion layer 10 of the present invention need not be disposed on the entire periphery of the light-emitting area. When the adhesion layer 10 is disposed on the entire periphery of the light-emitting area, for example, as shown by display area 18 and adhesion layer 10 in FIG. 8, the adhesion layer 10 may be disposed outside peripheral circuits, as shown by 19 in FIG. 8, so as to surround the four sides. In this case, a stronger moisture-proof effect can be achieved. When the adhesion layer 10 is not disposed on the entire periphery of the light-emitting area, for example, as shown in FIG. 7, the adhesion layer 10 may be disposed so as to surround the three sides except for lead-out wiring 20. When the adhesion layer 10 is formed so as to be electrically insulated from the lead-out wiring 20, electrical insulation can be more reliably achieved by this structure.

Figure 9:
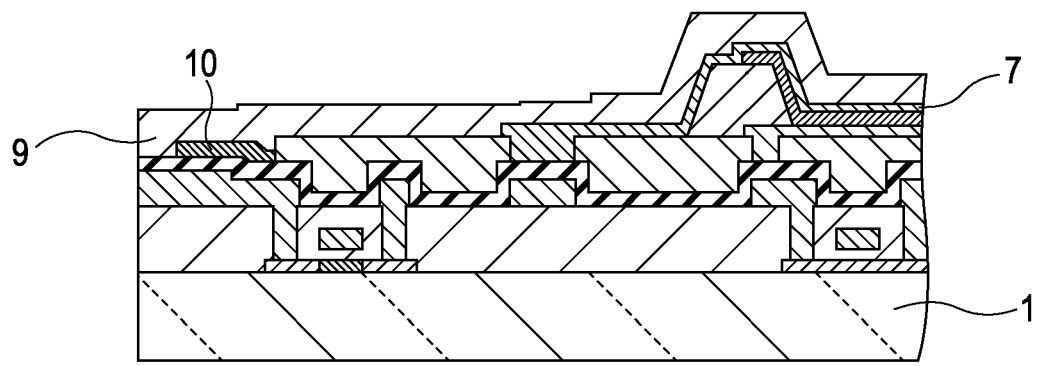
FIG. 9 is a schematic cross-sectional view showing another example of a position where the adhesion layer of the present invention is formed.

When the adhesion layer 10 is exposed at the edge of the organic light-emitting device and the exposed adhesion layer 10 itself becomes an intrusion path for moisture or a gas component, the adhesion layer 10 can be disposed so as to be covered with the sealing layer 9. More specifically, as shown in FIG. 9, the adhesion layer 10 is disposed between the sealing layer 9 and the insulating layer 3 and is covered with the sealing layer 9 so as not to be exposed on the edge. This structure can prevent moisture or the like from intruding through the adhesion layer 10.

The adhesion layer 10 is formed between the sealing layer 9 and the substrate and forms an interface with the glass substrate 1 or the insulating layer 3 and the planarizing layer 4. The adhesion layer 10 can form an interface with the lead-out wiring 20 or the planarizing layer 4 and the second electrode 7. The material and the thickness of the adhesion layer 10 can be determined so as to improve the adhesivity at the above interface. When the adhesivity of the interface cannot be improved, areas where the adhesion layer 10 is not provided may be partly present. More specifically, the adhesion layer 10 can be a layer that smoothes irregularities of the underlayer, which decreases the adhesivity of the sealing layer 9. In addition, the adhesion layer 10 can be a layer that increases the chemical bonding strength and the physical attractive force between the underlayer and the sealing layer 9. The adhesion layer 10 generally has a high shielding property against moisture and gas component intrusion.

The material of the adhesion layer 10 of the present invention is not particularly limited as long as the above characteristics can be satisfied. Examples thereof include a diamond-like carbon (DLC) film and inorganic films containing one element selected from In, Sn, Zn, and Si. The adhesion layer 10 may be composed of the same material as that of the first electrode 5 or the second electrode 7. When the adhesion layer 10 is formed of the same material as that of the second electrode 7, the adhesion layer 10 and the second electrode 7 can be formed at the same time.

When the sealing layer 9 is composed of stacked layers, it is sufficient that any one layer constituting the sealing layer 9 is in contact with the adhesion layer 10. The adhesion layer 10 can be in contact with the layer having the highest moisture-shielding property and the highest gas barrier property among the layers constituting the sealing layer 9. For this purpose, it is effective that the arrangement position of each layer constituting the sealing layer 9 is changed in accordance with the position of the adhesion layer 10.

An example of a process of producing the organic light-emitting device of the present invention will now be sequentially described using the organic light-emitting device shown in FIG. 1 as an example.

Deposition of First Electrode 5

The TFT 2 is formed on the glass substrate 1. The insulating layer 3 and the planarizing layer 4 are sequentially deposited thereon. In order to electrically connect with electrodes of the TFT 2, a contact hole is formed on the insulating layer 3 and the planarizing layer 4 by etching, and a Ag film is then deposited by sputtering so as to be formed on the contact hole. Subsequently, the Ag film is etched so that the Ag film is formed at positions corresponding to each organic light-emitting portion.

Deposition of Organic Compound Layer 6

A hole-transporting layer, a luminescent layer, an electron-transporting layer, and an electron injection layer are conventionally formed on the substrate having the first electrode thereon by vacuum deposition. In a device including RGB three-color pixels, these layers are formed only on the desired pixel using a shadow mask as required, thereby separating each luminescent color.

Depositions of Second Electrode 7 and Adhesion Layer 10

The second electrode 7 composed of ITO is deposited on the organic compound layer 6 by sputtering so as to have a thickness of 60 nm. The adhesion layer 10 composed of ITO, which is the same material as that of the second electrode 7, is then deposited by sputtering so as to have a thickness of 100 nm.

Deposition of Sealing Layer 9

Thereafter, a silicon nitride film having a thickness of 5 μm is deposited by VHF plasma CVD so as to cover the planarizing layer 4, the organic compound layer 6, the second electrode 7, and the element isolation film 8. Thus, the sealing layer 9 is formed.

Among the above deposition steps, the steps from deposition of the organic compound layer 6 to the deposition of the sealing layer 9 are consistently performed under vacuum.

Formation of Members Disposed on Sealing Layer 9

The upper part of the stacked layers including the sealing layer 9 are then covered with the etching glass 11 having the moisture-absorbing layer 13 and a recess provided at the pixel portion. The periphery of the etching glass 11 is sealed with the adhesive 12. Subsequently, the circular polarizer 14 is bonded on the etching glass 11. The stacked, layered product, including the glass substrate 1, is cut at a position 0.3 mm from the edge of the etching glass 11 to prepare the organic light-emitting device shown in FIG. 1.

EXAMPLES

Advantages of the organic light-emitting device of the present invention will now be described using the following examples which illustrate certain preferred embodiments.

Example 1

An example will now be described with reference to FIG. 10.

Figure 10:
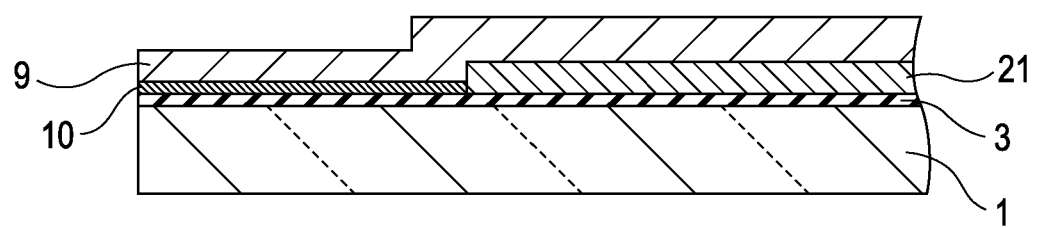
FIG. 10 is a schematic cross-sectional view showing the outline of the structure of a substrate for evaluation in Example 1.

In this example, an evaluation sample shown in FIG. 10 was prepared. Intrusion of moisture from a cut surface was evaluated by a change in transmittance due to calcium (Ca) corrosion. When a Ca film is reacted with water and oxygen, the transmittance of the Ca film changes.

A Ca film 21 having a thickness of 1,000 Å was partly formed by vacuum deposition on a substrate prepared by forming an insulating layer 3 on a glass substrate 1. An adhesion layer 10 that had a thickness of 100 nm and that was composed of ITO was deposited by sputtering on the periphery of the Ca deposition area. Subsequently, a silicon nitride film having a thickness of 5 μm was deposited by VHF plasma CVD so as to cover the Ca film 21 and the adhesion layer 10, thereby forming a sealing layer 9. From the charging of the substrate to the deposition of the sealing layer 9, these steps were consistently performed in a vacuum.

The glass substrate was cut outside the Ca deposition area at a position 0.3 mm from the edge of the Ca deposition area to prepare the evaluation sample shown in FIG. 10.

Reference Example 1

A reference example will now be described with reference to FIG. 11.

Figure 11:
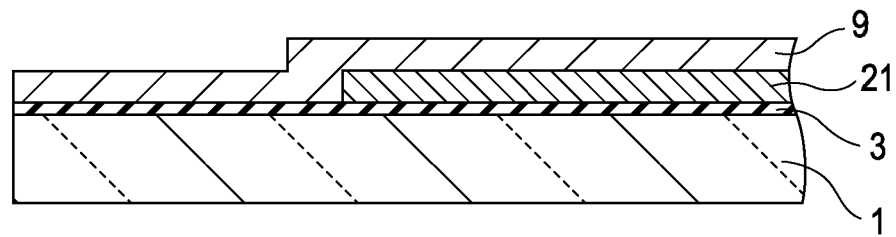
FIG. 11 is a schematic cross-sectional view showing the outline of the structure of a substrate for evaluation in Reference Example 1.

In this reference example, an evaluation sample shown in FIG. 11 was prepared. Intrusion of moisture from a cut surface was evaluated by a change in transmittance due to Ca corrosion.

The evaluation sample of this reference example was prepared by the same steps as in Example 1 except that the ITO film serving as the adhesion layer 10 was not formed.

Evaluation

The cut surface of the sample of Example 1 was observed with a scanning electron microscope (SEM). Upon observation, separation of a portion of the sealing layer 9 and cracks of the sealing layer 9 were deemed negligible. Damage to the sealing layer 9 due to cutting was observed within 0.05 mm from the cutting position. The evaluation sample of Example 1 was left to stand in a thermo-hygrostat at 60° C. and 90% RH for 1,000 hours, and the transmittance of the Ca film was then measured. The transmittance of the Ca film did not change.

In contrast, when the cut surface of the sample of Reference Example 1 was observed with the SEM, separation of a portion of the sealing layer 9 and cracks of the sealing layer 9 were observed. Damage to the sealing layer 9 due to cutting was observed within 0.5 mm from the cutting position. The evaluation sample of Reference Example 1 was left to stand in the thermo-hygrostat at 60° C. and 90% RH for 1,000 hours. The Ca film was corroded from the direction of the cut surface, and the transmittance was decreased over an area extending about 20 mm. These results showed that when an adhesion layer 10 was employed so as to be in contact with the sealing layer 9, moisture did not easily intrude.

Example 2

An example will now be described with reference to FIGS. 1 and 7.

In this example, as shown in FIG. 7, at the periphery of a display area 18 of an organic display device, an adhesion layer 10 was formed only at the sides on which peripheral circuits 19 were provided. The light-emitting characteristics of the element were evaluated.

As shown in FIG. 1, a TFT 2, an insulating layer 3, and an organic planarizing layer 4 were sequentially stacked on a glass substrate 1, and the periphery of a first electrode to be formed thereon was insulated by an element isolation film 8 composed of a polyimide resin. Thus, a substrate was prepared. An organic compound layer (stacked structure) 6 composed of DFLDPBi/DpyFL01+BDT3FL/2,9-bis[2-(9,9'-dimethylfluorenyl)]-1,10-phenanthroline/2,9-bis[2-(9,9'-dimethylfluorenyl)]-1,10-phenanthroline+$Cs_2CO_3$ was formed on the substrate by vacuum deposition. Each organic compound is shown by the following structural formula. A first electrode 5 was formed, and a hole-transporting layer, a luminescent layer, an electron-transporting layer, and an electron injection layer were then deposited in that order to form the organic compound layer 6. A second electrode 7 that was composed of ITO with a thickness of 60 nm was deposited thereon by sputtering to form pixels. An adhesion layer 10 that was composed of ITO with a thickness of 100 nm was then deposited by sputtering. Furthermore, a silicon nitride film having a thickness of 5 μm was deposited by VHF plasma CVD so as to cover the organic planarizing layer 4, the organic compound layer 6, the second electrode 7, the element isolation film 8, and the adhesion layer 10, thereby forming a sealing layer 9. From the charging of the substrate to the deposition of the sealing layer 9, these steps were consistently performed in a vacuum.

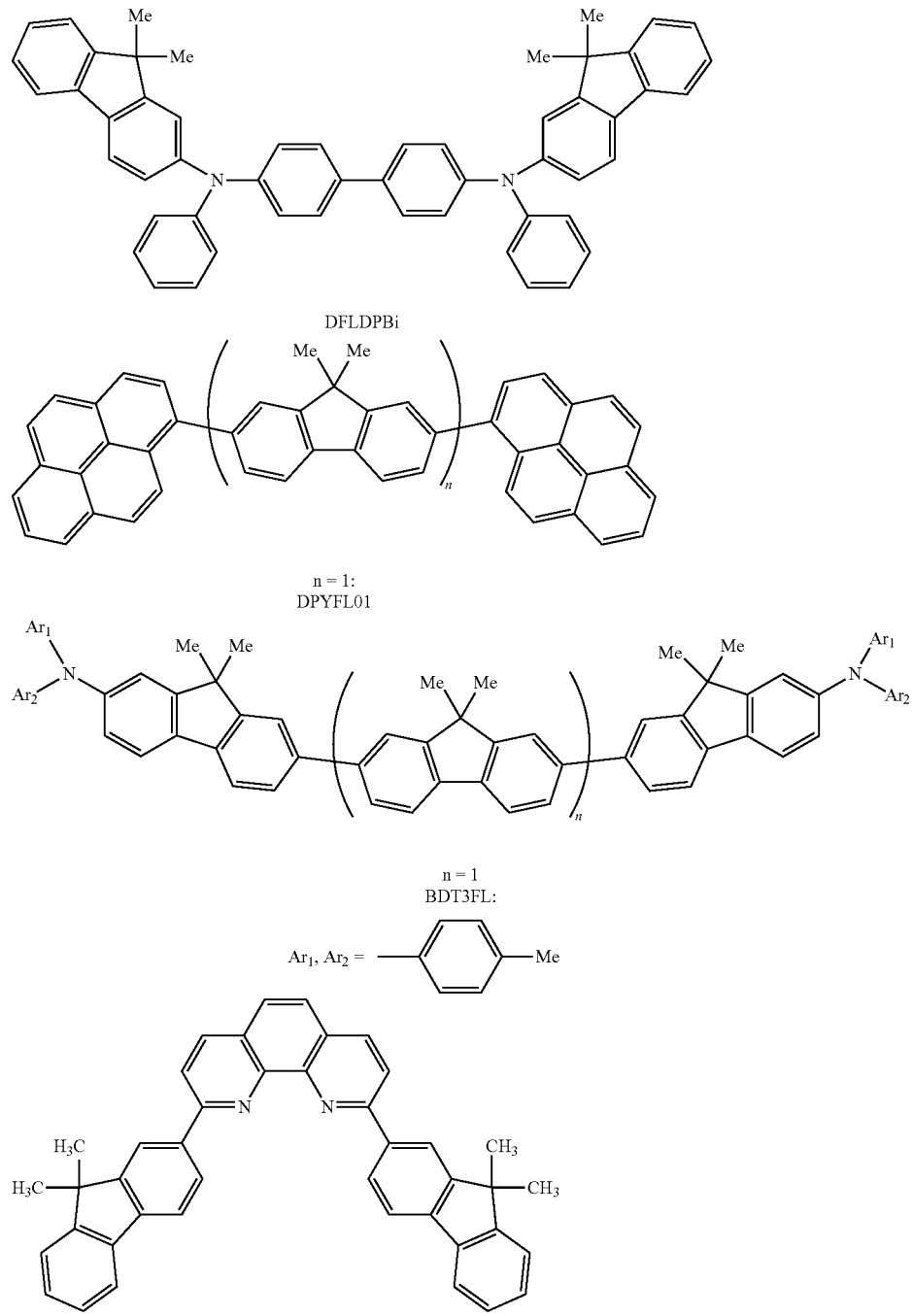

The upper part of the stacked layers including the sealing layer 9 was then covered with an etching glass 11 having a moisture-absorbing layer 13 and a recess provided at the pixel portion. The periphery of the etching glass 11 was sealed with the adhesive 12. Subsequently, a circular polarizer 14 was bonded on the etching glass 11. The glass substrate 1 was cut at a position 0.3 mm from the edge of the etching glass 11 to prepare the organic display device shown in FIG. 1.

Example 3

An example will now be described with reference to FIG. 12.

In this example, an adhesion layer 10 was formed on the same area as that of Example 2, and light-emitting characteristics of the element were evaluated.

Figure 12:
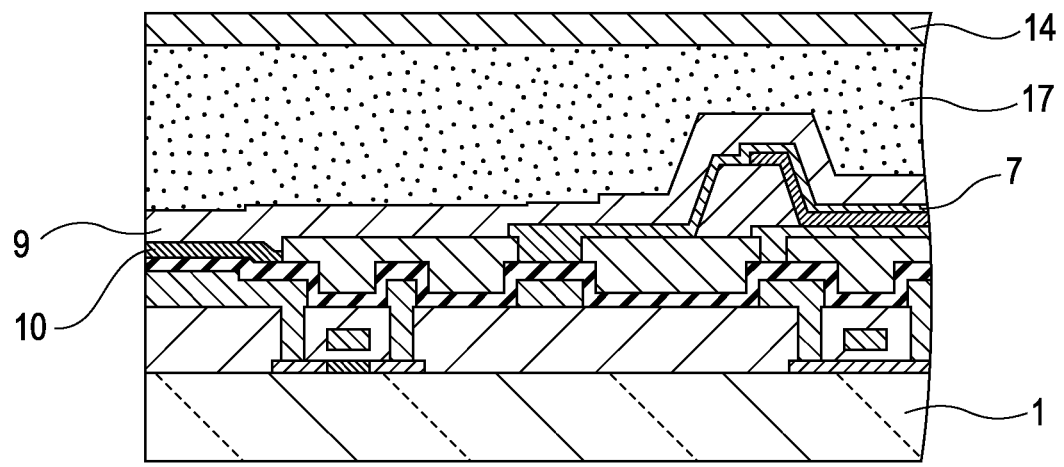
FIG. 12 is a schematic cross-sectional view showing the outline of the structure of a substrate for evaluation in Example 3.

As shown in FIG. 12, the steps of preparing the substrate to forming the organic compound layer 6 were performed as in Example 2. A second electrode 7 and an adhesion layer 10 that were composed of ITO with a thickness of 60 nm were then formed by sputtering at the same time. Subsequently, the glass substrate 1 was cut outside the deposition area of the organic planarizing layer 4 at a position 0.3 mm from the edge of the deposition area of the organic planarizing layer 4. A circular polarizer 14 was bonded on the organic display device with a pressure-sensitive adhesive 17 to prepare the organic display device shown in FIG. 12.

Example 4

An example will now be described with reference to FIGS. 8 and 13.

Figure 8:
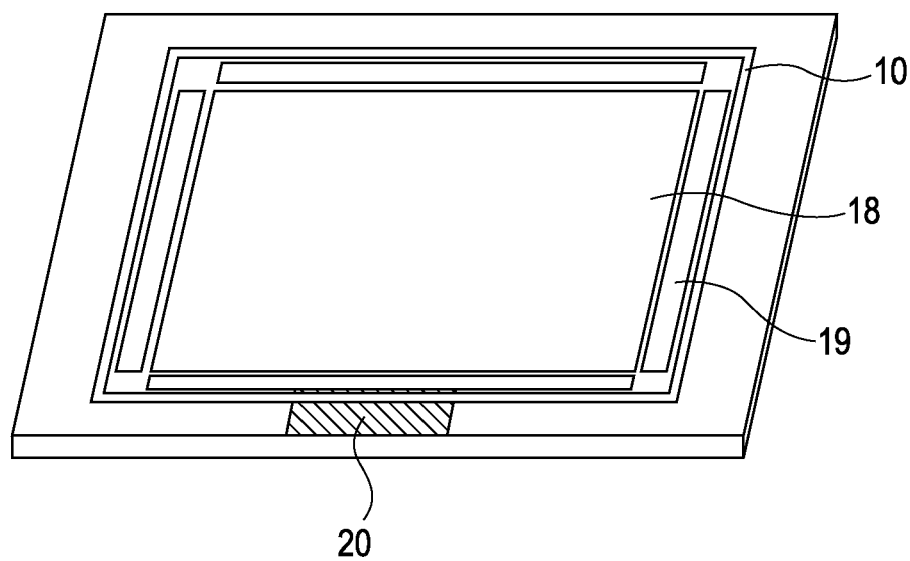
FIG. 8 is a schematic top view showing another example of a position where the adhesion layer of the present invention is formed.

In this example, as shown in FIG. 8, an adhesion layer 10 was formed around the entire periphery of a display area 18 of an organic display device, and light-emitting characteristics of the element were evaluated. A power supply and signal wiring were insulated from the adhesion layer 10.

Figure 13:
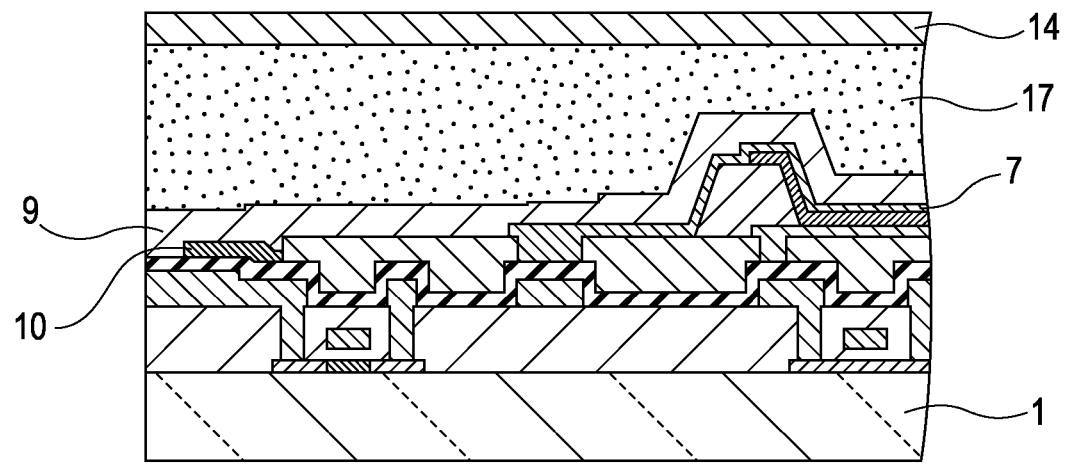
FIG. 13 is a schematic cross-sectional view showing the outline of the structure of a substrate for evaluation in Example 4.

As shown in FIG. 13, the step of preparing the substrate to the step of forming the organic compound layer 6 were performed as in Example 2. A second electrode 7 and an adhesion layer 10 that were composed of ITO with a thickness of 60 nm were then formed by sputtering at the same time. Subsequently, the glass substrate 1 was cut outside the deposition area of the organic planarizing layer 4 at a position 0.3 mm from the edge of the deposition area of the organic planarizing layer 4, i.e., at a position 0.1 mm from the edge of the deposition area of the adhesion layer 10. A circular polarizer 14 was bonded on the organic display device with a pressure-sensitive adhesive 17 to prepare the organic display device shown in FIG. 13.

Reference Example 2

A reference example will now be described with reference to FIG. 14.

Figure 14:
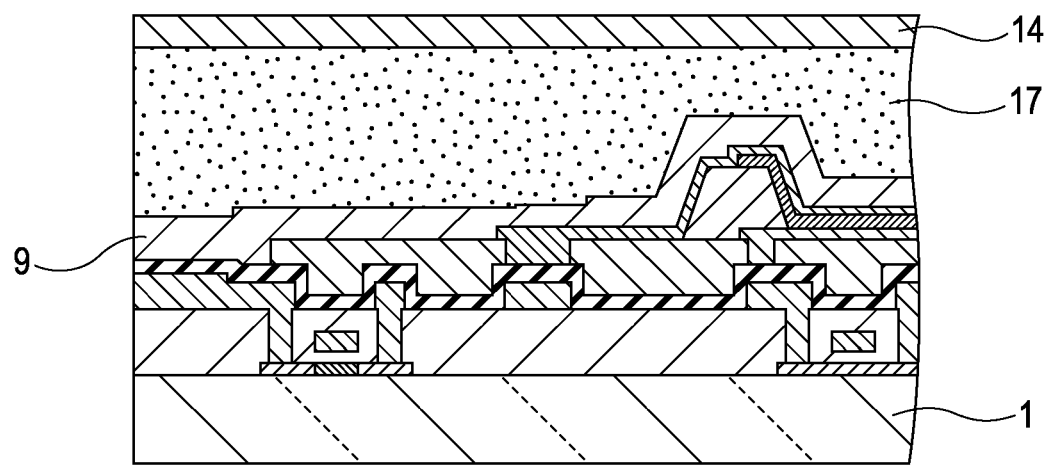
FIG. 14 is a schematic cross-sectional view showing the outline of the structure of a substrate for evaluation in Reference Example 2.

An organic display device having the structure shown in FIG. 14 was prepared as in Example 3 except that the adhesion layer 10 was not formed at the periphery of the display area 18 of the organic display device.

Evaluation

The organic EL panels of Examples 2, 3, and 4 were left to stand in a thermo-hygrostat at 60° C. and 90% RH for 1,000 hours and then evaluated. Degradation of V-I characteristics or degradation of luminance was not observed. A change in the luminance from the peripheral area of the organic EL display devices or generation of dark spots with a diameter of 1 μm or more was not observed. Degradation of the luminance from the periphery of pixels or generation of dark spots with a diameter of 1 μm or more was also not observed.

In contrast, when the organic EL panel of Reference Example 2 was left to stand in the thermo-hygrostat at 60° C. and 90% RH for 1,000 hours, degradation of V-I characteristics and degradation of luminance were observed at the periphery of the display area. Degradation of V-I characteristics or degradation of luminance was not observed at the center of the display area.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-079058 filed Mar. 22, 2006, and No. 2007-019470 filed Jan. 30, 2007, which are hereby incorporated by reference herein in their entirety.

What is claimed is:

1. An organic light-emitting device comprising:
   a substrate including at least a base material;
   an insulating layer disposed at the substrate;
   an organic planarizing layer which covers the insulating layer such that the insulating layer is disposed under the organic planarizing layer;
   at least one organic light-emitting element which (a) includes a pair of electrodes provided on the substrate and an organic compound layer disposed between the pair of electrodes, and (b) provides a light-emitting area;
   an inorganic sealing layer provided on the organic light-emitting element and the surface of the substrate; and
   an adhesion layer which is provided between the insulating layer and the inorganic sealing layer in a vertical direction of the substrate and is in contact with the insulating layer and the inorganic sealing layer for improving the adhesiveness of the inorganic sealing layer,
   wherein the adhesion layer is provided only at the periphery of the light-emitting area in an in-plane direction of the substrate,
   wherein the adhesion layer is covered with the inorganic sealing layer, so that the adhesion layer is not exposed, and
   wherein the adhesion layer comprises an inorganic film.

2. The organic light-emitting device according to claim 1, wherein the adhesion layer is formed continuously in the circumference part of the light-emitting area.

3. The organic light-emitting device according to claim 1, wherein the adhesion layer is disposed non-continuously from the light emitting area toward an edge portion of the substrate.

4. The organic light-emitting device according to claim 3, wherein the adhesion layer comprises indium tin oxide (ITO).

5. An organic light-emitting device comprising:
   a substrate including at least a base material;
   an insulating layer disposed at the substrate;
   an organic planarizing layer which covers the insulating layer such that the insulating layer is disposed under the organic planarizing layer;
   at least one organic light-emitting element which (a) includes a pair of electrodes provided on the substrate and an organic compound layer disposed between the pair of electrodes, and (b) provides a light-emitting area;
   an inorganic sealing layer provided on the light-emitting area and the periphery of the light-emitting area; and
   an adhesion layer which is provided between the insulating layer and the inorganic sealing layer in a vertical direction of the substrate and is in contact with the insulating layer and the inorganic sealing layer,
   wherein the adhesion layer is provided only at the periphery of the light-emitting area in an in-plane direction of the substrate,
   wherein the adhesion layer is covered with the inorganic sealing layer, so that the adhesion layer is not exposed, and
   wherein the adhesion layer comprises an inorganic film.

* * * * *